(12) United States Patent
Sanuki

(10) Patent No.: US 11,257,802 B2
(45) Date of Patent: Feb. 22, 2022

(54) SEMICONDUCTOR DEVICE WITH BONDING PADS AND METHOD OF MANUFACTURING THE SAME

(71) Applicant: TOSHIBA MEMORY CORPORATION, Tokyo (JP)

(72) Inventor: Tomoya Sanuki, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/549,486

(22) Filed: Aug. 23, 2019

(65) Prior Publication Data

US 2020/0279841 A1 Sep. 3, 2020

(30) Foreign Application Priority Data

Mar. 1, 2019 (JP) .............................. JP2019-037626

(51) Int. Cl.
*H01L 25/18* (2006.01)
*H01L 23/00* (2006.01)
(Continued)

(52) U.S. Cl.
CPC ............ *H01L 25/18* (2013.01); *H01L 23/481* (2013.01); *H01L 23/528* (2013.01); *H01L 24/05* (2013.01);
(Continued)

(58) Field of Classification Search
CPC ....... H01L 25/18; H01L 24/08; H01L 23/481; H01L 25/50; H01L 23/528; H01L 24/05; H01L 24/09; H01L 2224/0557; H01L 2224/08145; H01L 2924/1431; H01L 2924/14511; H01L 2224/09181; H01L 27/11582; H01L 18/11573; H01L 23/00; H01L 25/00; H01L 2224/94; H01L 2224/80201; H01L 2224/80357; H01L 2224/80895; H01L 2224/08147; H01L 2224/80948; H01L 2224/80896; H01L 2224/80001; H01L 2924/00014
(Continued)

(56) References Cited

U.S. PATENT DOCUMENTS 6,028,360 A * 2/2000 Nakamura .......... H01L 23/5226
257/758
6,208,547 B1 * 3/2001 Ooishi .................. G11C 5/025
257/E27.097

(Continued)

FOREIGN PATENT DOCUMENTS

| JP | 2010-129686 A | 6/2010 |
| TW | 201705411 A | 2/2017 |
| TW | 201724303 A | 7/2017 |

*Primary Examiner* — Alexander O Williams
(74) *Attorney, Agent, or Firm* — Foley & Lardner LLP

(57) ABSTRACT

A semiconductor device includes: a first semiconductor substrate and a logic circuit provided on the first semiconductor substrate; a memory cell provided above the logic circuit and a second semiconductor substrate provided above the memory cell; a bonding pad provided above the second semiconductor substrate and electrically connected to the logic circuit; and a wiring provided above the second semiconductor substrate. The wiring is electrically connected to the memory cell, and includes at least one of a data signal line, a control voltage line, and a power supply line.

14 Claims, 9 Drawing Sheets

(51) Int. Cl.
  *H01L 23/48* (2006.01)
  *H01L 25/00* (2006.01)
  *H01L 23/528* (2006.01)

(52) U.S. Cl.
  CPC .............. *H01L 24/08* (2013.01); *H01L 24/09*
  (2013.01); *H01L 25/50* (2013.01); *H01L
  2224/0557* (2013.01); *H01L 2224/08145*
  (2013.01); *H01L 2224/09181* (2013.01); *H01L
  2924/1431* (2013.01); *H01L 2924/14511*
  (2013.01)

(58) Field of Classification Search
  USPC ......................................................... 257/773
  See application file for complete search history.

(56) References Cited

U.S. PATENT DOCUMENTS

| | | | |
|---|---|---|---|
| 6,328,681 B1 * | 12/2001 | Stephens | F16C 13/00 492/56 |
| 7,696,007 B2 | 4/2010 | Kikuchi | |
| 9,691,782 B1 * | 6/2017 | Hwang | H01L 27/0266 |
| 10,629,616 B1 * | 4/2020 | Kai | H01L 27/11565 |
| 2004/0012053 A1 * | 1/2004 | Zhang | H01L 29/74 257/390 |
| 2011/0193136 A1 * | 8/2011 | Moritoki | H01L 27/10885 257/211 |
| 2014/0065767 A1 | 3/2014 | Sugiyama et al. | |
| 2017/0005024 A1 | 1/2017 | Shimazaki | |
| 2018/0145104 A1 * | 5/2018 | Kim | H01L 27/1462 |
| 2018/0261575 A1 | 9/2018 | Tagami | |
| 2018/0277497 A1 | 9/2018 | Matsuo | |
| 2018/0286910 A1 * | 10/2018 | Kobayashi | H01L 27/14609 |
| 2018/0374864 A1 * | 12/2018 | Fukuzumi | H01L 24/00 |
| 2019/0019693 A1 * | 1/2019 | Or-Bach | H01L 21/823487 |
| 2019/0273090 A1 * | 9/2019 | Fukuzumi | H01L 25/0657 |
| 2020/0144242 A1 * | 5/2020 | Park | H01L 25/18 |
| 2020/0152573 A1 * | 5/2020 | Oh | H01L 27/11556 |
| 2020/0185397 A1 * | 6/2020 | Chibvongodze | H01L 27/11565 |
| 2020/0203329 A1 * | 6/2020 | Kanamori | H01L 27/11556 |
| 2020/0227561 A1 * | 7/2020 | Yamazaki | H01L 29/78648 |
| 2020/0227562 A1 * | 7/2020 | Yamazaki | H01L 21/283 |
| 2021/0035965 A1 * | 2/2021 | Mizutani | H01L 25/0657 |
| 2021/0082865 A1 * | 3/2021 | Baraskar | H01L 27/11573 |

\* cited by examiner

US 11,257,802 B2

SEMICONDUCTOR DEVICE WITH BONDING PADS AND METHOD OF MANUFACTURING THE SAME

CROSS-REFERENCE TO RELATED APPLICATION

This application is based upon and claims the benefit of priority from Japanese Patent Application No. 2019-037626, filed Mar. 1, 2019, the entire contents of which are incorporated herein by reference.

FIELD

Embodiments described herein relate generally to a semiconductor device and a method of manufacturing the same.

BACKGROUND

Since a semiconductor device such as a three-dimensional memory generally includes many wirings, it is important to lay out the wirings effectively in terms of design. For example, a layout that allows noise reduction, low resistance, speed-up, and the like is desired.

An example of related art includes JP-A-2010-129686.

DETAILED DESCRIPTION

Figure 1:
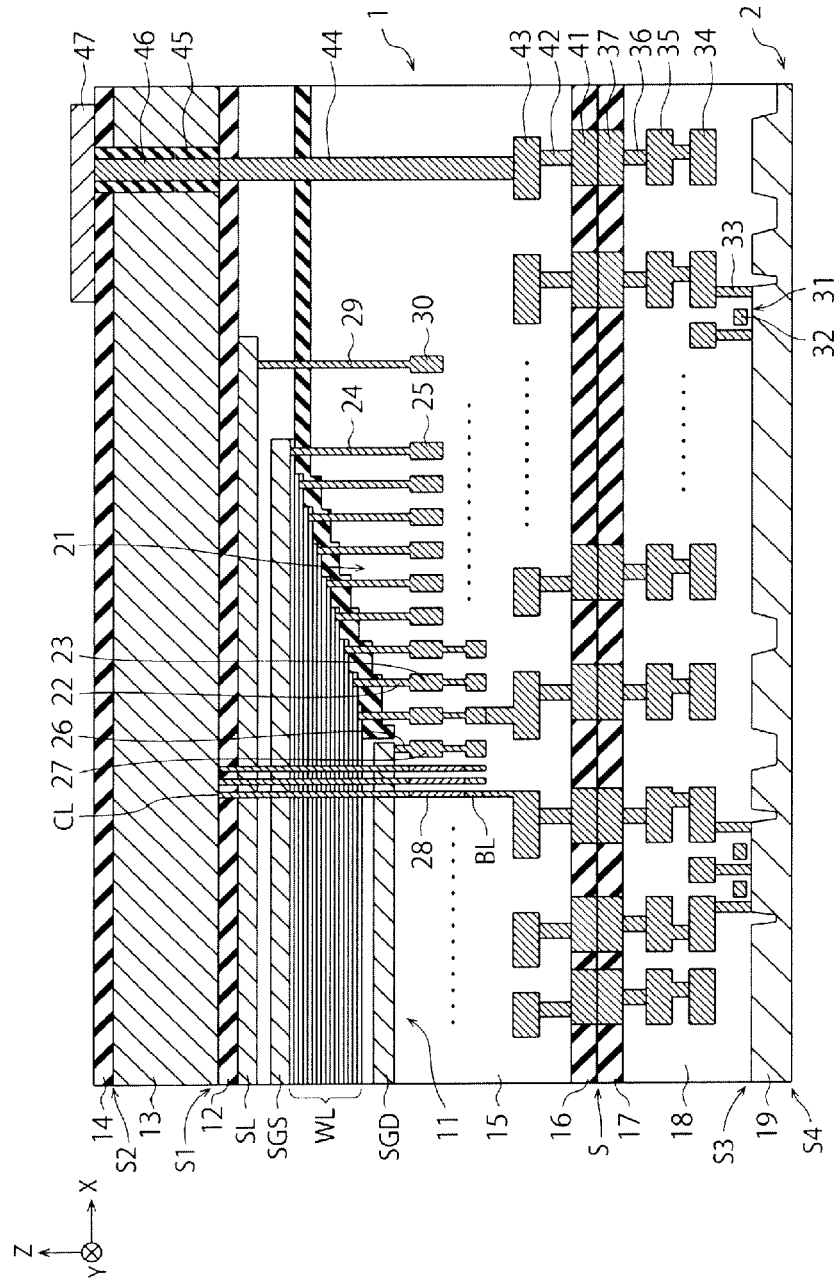
FIG. 1 is a cross-sectional view showing a structure of a semiconductor device of a first embodiment.

Embodiments provide a semiconductor device in which a wiring can be effectively laid out and a method of manufacturing the same.

In general, according to one embodiment, a semiconductor device includes a first substrate and a logic circuit provided on the first substrate. The device further includes a memory cell provided above the logic circuit and a second substrate provided above the memory cell. The device further includes a bonding pad provided above the second substrate and electrically connected to the logic circuit. The device further includes a wiring that is provided above the second substrate, is electrically connected to the memory cell, and includes at least one of a data signal line, a control voltage line, or a power supply line.

Hereinafter, embodiments of the present disclosure will be described with reference to the drawings. In FIG. 1 to FIG. 9, the same or similar components are denoted by the same reference numerals, and a repetitive description thereof will be omitted.

First Embodiment

FIG. 1 is a cross-sectional view showing a structure of a semiconductor device of a first embodiment. The semiconductor device in FIG. 1 is a three-dimensional memory in which a memory array chip 1 (hereinafter, simply referred to as an array chip 1) and a circuit chip 2 are bonded.

The array chip 1 includes a memory cell array 11 that includes a plurality of memory cells, an insulating layer 12 on the memory cell array 11, a substrate 13 on the insulating layer 12, an insulating layer 14 on the substrate 13, an interlayer insulating film 15 under the memory cell array 11, and a first insulating layer 16 under the interlayer insulating film 15. The insulating layers 12 and 14 are, for example, a silicon oxide film or a silicon nitride film. The substrate 13 is, for example, a semiconductor substrate such as a silicon substrate. The substrate 13 is an example of a second substrate.

The circuit chip 2 is provided under the array chip 1. A symbol S represents a bonding surface between the array chip 1 and the circuit chip 2. The circuit chip 2 includes a second insulating layer 17, an interlayer insulating film 18 under the second insulating layer 17, and a substrate 19 under the interlayer insulating film 18. The substrate 19 is, for example, a semiconductor substrate such as a silicon substrate. The substrate 19 is an example of a first substrate.

In FIG. 1, two mutually orthogonal directions parallel to surfaces S1 and S2 of the substrate 13 or surfaces S3 and S4 of the substrate 19 are defined as the X direction and the Y direction, respectively. Here, a direction perpendicular to a plane of paper is defined as the Y direction. Further, the Z direction is defined as perpendicular to the surfaces S1 and S2 of the substrate 13 or the surfaces S3 and S4 of the substrate 19. In the present specification, a +Z direction is upwards the plane of paper and a −Z direction is downwards the plane of paper. The −Z direction may or may not coincide with the gravity direction.

The array chip 1 includes a plurality of word lines WL, a source side selection gate SGS, a drain side selection gate SGD, and a source line SL as an electrode layer in the memory cell array 11. The memory cell array 11 includes a staircase structure portion 21. As shown in FIG. 1, an end portion of each word line WL is electrically connected with a word wiring layer 23 via a contact plug 22 and the source side selection gate SGS is electrically connected with a source side selection gate wiring layer 25 via a contact plug 24. Further, the drain side selection gate SGD is electrically connected with a drain side selection gate wiring layer 27 via a contact plug 26 and the source line SL is electrically connected with a source wiring layer 30 via a contact plug 29. A columnar portion CL that penetrates the word line WL, the source side selection gate SGS, the drain side selection gate SGD, and the source line SL is electrically connected with a bit line BL via a plug 28, and is also electrically connected with the substrate 13.

The circuit chip 2 includes a plurality of transistors 31 on the substrate 19. Each transistor 31 includes a gate electrode 32 provided on the substrate 19 via a gate insulating film and a source diffusion layer and a drain diffusion layer (not shown) provided in the substrate 19. The circuit chip 2 further includes a plurality of plugs 33 provided on the source diffusion layer or the drain diffusion layer of the transistor 31, a wiring layer 34 that is provided on the plugs 33 and includes a plurality of wirings, and a wiring layer 35 that is provided on the wiring layer 34 and includes a plurality of wirings. The circuit chip 2 further includes a plurality of via plugs 36 provided on the wiring layer 35 and a plurality of second metal pads 37 provided on the via plugs 36 in the second insulating layer 17. The circuit chip 2 functions as a control circuit (a logic circuit) that controls the array chip 1.

The array chip 1 includes a plurality of first metal pads 41 provided respectively corresponding to the plurality of second metal pads 37 in the first insulating layer 16, a plurality of via plugs 42 provided respectively corresponding to the plurality of first metal pads 41, and a wiring layer 43 that includes a plurality of wirings provided respectively corresponding to the via plugs 42. Each word line WL and each bit line BL of the present embodiment are electrically connected with a corresponding wiring in the wiring layer 43. The array chip 1 further includes a first plug 44 provided in the interlayer insulating film 15 and the insulating layer 12 and on the wiring layer 43, a second plug 46 provided in the substrate 13 and the insulating layer 14 via the interlayer insulating film 45 and provided on the first plug 44, and a pad 47 provided on the insulating layer 14 and on the second plug 46. The pad 47 is an external connection pad (a bonding pad) of the semiconductor device of the present embodiment, and may be connected to a mounting substrate or other devices via a solder ball, a metal bump, a bonding wire, and the like.

In the present embodiment, the first insulating layer 16 is formed on a lower surface of the interlayer insulating film 15. Alternatively, the first insulating layer 16 may be provided and integrated in the interlayer insulating film 15. Similarly, in the present embodiment, the second insulating layer 17 is formed on an upper surface of the interlayer insulating film 18. Alternatively, the second insulating layer 17 may be provided and integrated in the interlayer insulating film 18.

Figure 2:
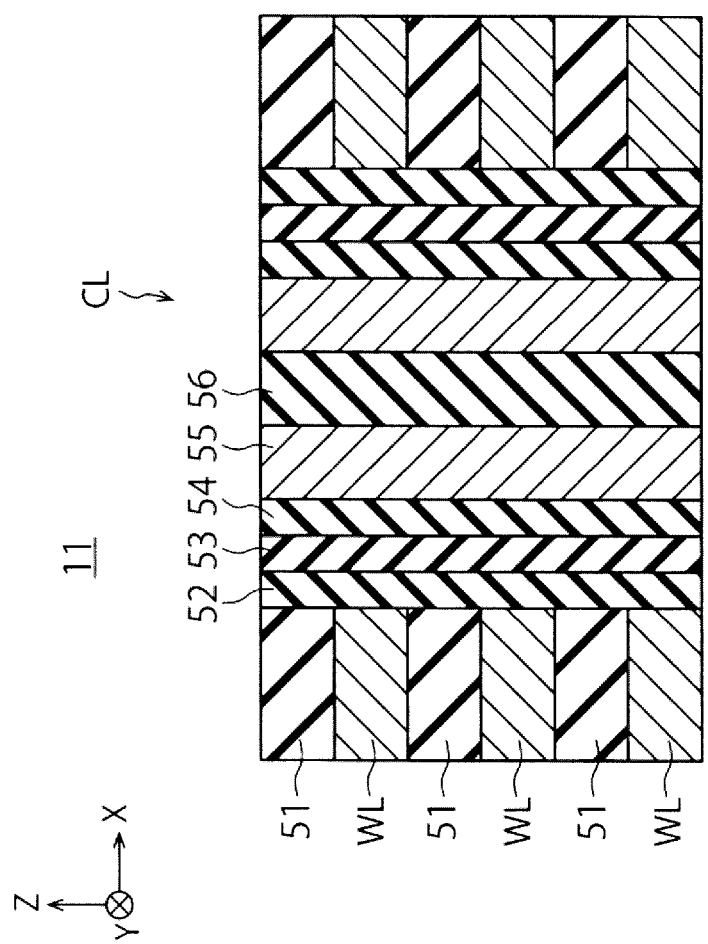
FIG. 2 is a cross-sectional view showing a structure of a columnar portion of the first embodiment.

FIG. 2 is a cross-sectional view showing a structure of the columnar portion of the first embodiment.

As shown in FIG. 2, the memory cell array 11 includes a plurality of word lines WL and a plurality of insulating layers 51 alternately stacked on the interlayer insulating film 15. Each word line WL is, for example, a W (tungsten) layer. Each insulating layer 51 is, for example, a silicon oxide film.

The columnar portion CL successively includes a block insulating film 52, a charge storage layer 53, a tunnel insulating film 54, a channel semiconductor layer 55, and a core insulating film 56. The charge storage layer 53 is, for example, a silicon nitride film, and is formed on a side surface of the word line WL and the insulating layer 51 via the block insulating film 52. The channel semiconductor layer 55 is, for example, a silicon layer, and is formed on a side surface of the charge storage layer 53 via the tunnel insulating film 54. An example of the block insulating film 52, the tunnel insulating film 54, and the core insulating film 56 is a silicon oxide film or a metal insulating film.

Figure 3:
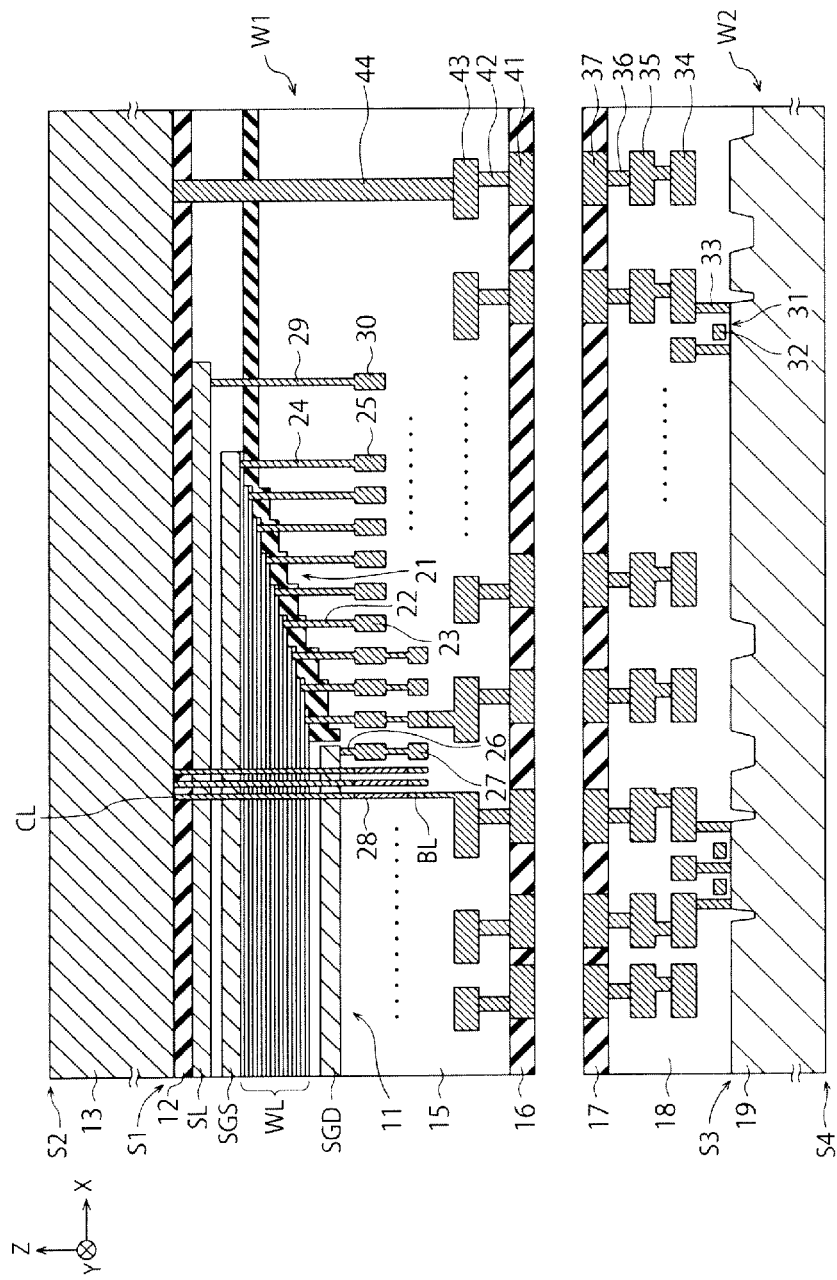
FIG. 3 is a cross-sectional view that explains a step of a method of manufacturing the semiconductor device of the first embodiment.

FIG. 3 is a cross-sectional view that explains a step of a method of manufacturing the semiconductor device of the first embodiment.

FIG. 3 shows an array wafer W1 including a plurality of array chips 1, and a circuit wafer W2 including a plurality of circuit chips 2. The array wafer W1 is also referred to as a memory wafer and the circuit wafer W2 is also referred to as a CMOS wafer. The array wafer W1 includes the memory cell array 11 and the like formed on the substrate 13 and the circuit wafer W2 includes the transistor 31 and the like formed on the substrate 19.

First, the array wafer W1 and the circuit wafer W2 are bonded together by mechanical pressure. Accordingly, the first insulating layer 16 and the second insulating layer 17 are bonded. Next, the array wafer W1 and the circuit wafer W2 are annealed at 400° C. Accordingly, the first metal pad 41 and the second metal pad 37 are coupled.

Then, after the substrates 13 and 19 are thinned by a CMP (Chemical Mechanical Polishing), the array wafer W1 and the circuit wafer W2 are cut into a plurality of chips. Thus, the semiconductor device in FIG. 1 is manufactured. Further, the insulating layer 14, the insulating film 45, the second plug 46, and the pad 47 are formed, for example, on the substrate 13 or in the substrate 13 after the substrate 13 is thinned.

In the present embodiment, the array wafer W1 and the circuit wafer W2 are bonded together. Alternatively, the array wafers W1 may be bonded together, and the circuit chip 2 may be separately provided. The content described above with reference to FIG. 1 to FIG. 3 and the content to be described later with reference to FIG. 4 to FIG. 9 may also be applied to bonding between the array wafers W1.

Further, the array wafer W1 includes the memory cell array 11 of the three-dimensional memory in the present embodiment. Alternatively, the array wafer W1 may include a memory cell array of a two-dimensional memory.

FIG. 1 shows a boundary surface between the first insulating layer 16 and the second insulating layer 17 and a boundary surface between the first metal pad 41 and the second metal pad 37, although these boundary surfaces are generally not observed after the above-described annealing. However, positions of these boundary surfaces can be estimated by detecting, for example, an inclination of a side surface of the first metal pad 41 or a side surface of the second metal pad 37, or a positional deviation between the side surface of the first metal pad 41 and the second metal pad 37.

Figure 4:
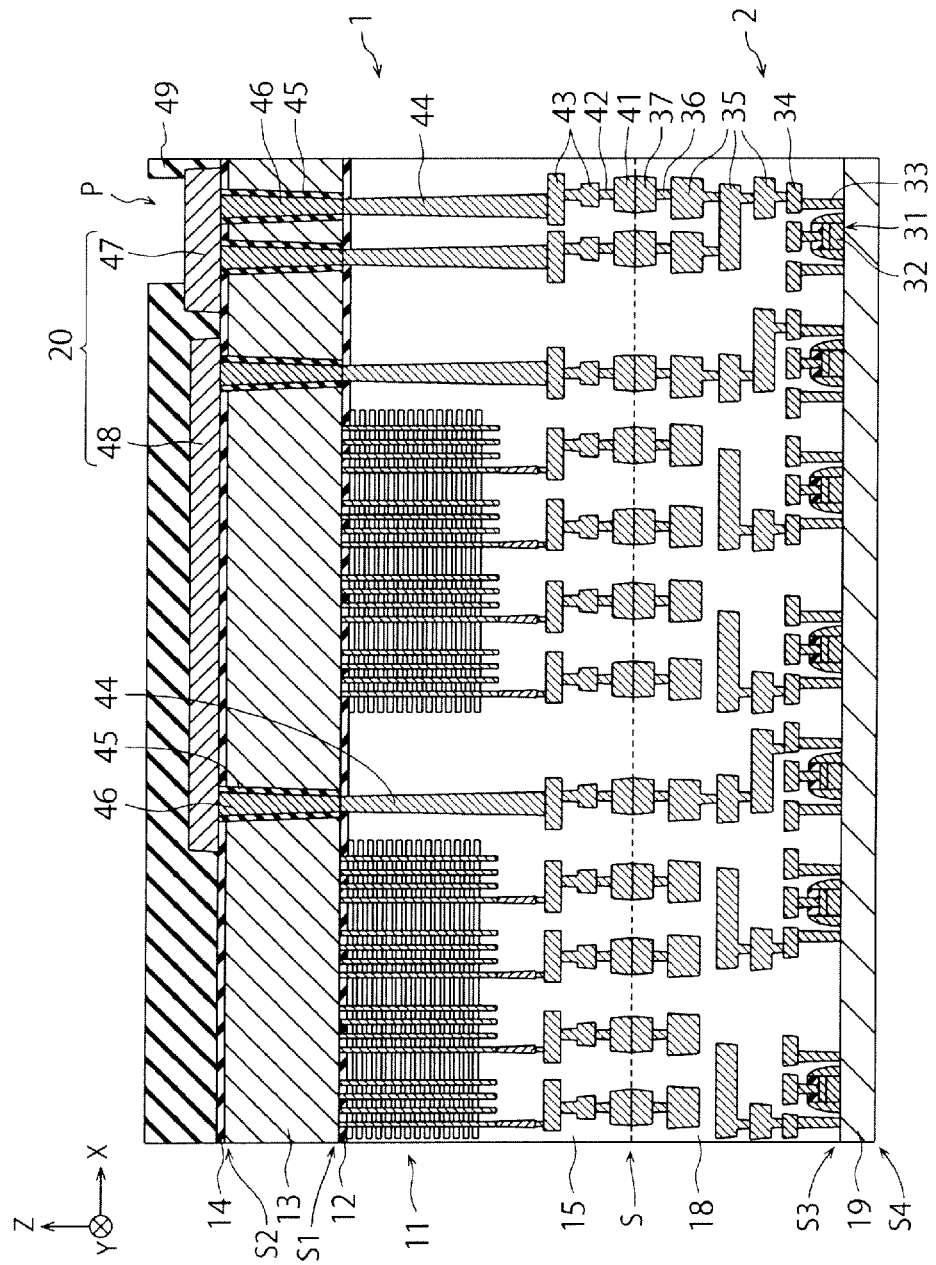
FIG. 4 is another cross-sectional view showing the structure of the semiconductor device of the first embodiment.

FIG. 4 is another cross-sectional view showing the structure of the semiconductor device of the first embodiment and shows the semiconductor device of the first embodiment from a viewpoint different from FIG. 1. FIG. 1 shows a set of the first plug 44, the insulating film 45, and the second plug 46, that are provided on the wiring layer 43, while FIG. 4 shows four sets of the first plug 44, the insulating films 45, and the second plugs 46, that are provided on the wiring layer 43.

FIG. 4 further shows a wiring layer 20 formed on the insulating layer 14. The wiring layer 20 is, for example, a metal conductive layer such as an Al (aluminum) layer. The wiring layer 20 includes a wiring 48 (a routing wiring) that electrically connects a portion between the substrate 13 and the substrate 19 and other portions. In FIG. 4, a set of the first and the second plugs 44 and 46 are electrically connected to one end portion of the wiring 48, and another set of the first and the second plugs 44 and 46 are electrically connected to the other end portion of the wiring 48. The wiring 48 in FIG. 4 is electrically connected to a logic circuit in the circuit chip 2 via these end portions.

The wiring layer 20 of the present embodiment includes not only the wiring 48 but also the pad 47. That is, the pad 47 and the wiring 48 of the present embodiment are formed by the same wiring layer 20. Accordingly, the pad 47 and the wiring 48 can be formed without further complex steps. In the present embodiment, after the array wafer W1 and the circuit wafer W2 are bonded together (see FIG. 3), the insulating layer 14 and the wiring layer 20 are successively formed on the substrate 13, and then the wiring layer 20 is processed by etching to form the pad 47 and the wiring 48.

FIG. 4 shows a step between an upper surface of the pad 47 and an upper surface of the wiring 48 for clear understanding of the description. Alternatively, such a step may not be provided. Further, the wiring 48 is provided at a position not in contact with the pad 47 in the present embodiment. Alternatively, the wiring 48 may be provided at a position in contact with the pad 47 as in an embodiment to be described later. Whether or not the wiring 48 is provided at a position in contact with the pad 47 is determined according to usage of the wiring 48 such as a signal line (a data signal line), a control voltage line, and a power supply line.

FIG. 4 further shows a passivation film 49 formed on the wiring layer 20. The passivation film 49 is, for example, an insulating film such as a silicon oxide film. The passivation film 49 covers an upper surface of the wiring 48 and has an opening P through which an upper surface of the pad 47 is exposed. Accordingly, the wiring 48 can be protected by the passivation film 49, and a solder ball, a metal bump, a bonding wiring, and the like can be connected to the pad 47 in the opening P.

The pad 47 in FIG. 4 is disposed on two sets of the first and the second plugs 44 and 46, and is electrically connected to the logic circuit in the circuit chip 2 via these plugs. Shapes of these plugs will be described later in detail.

Figure 5:
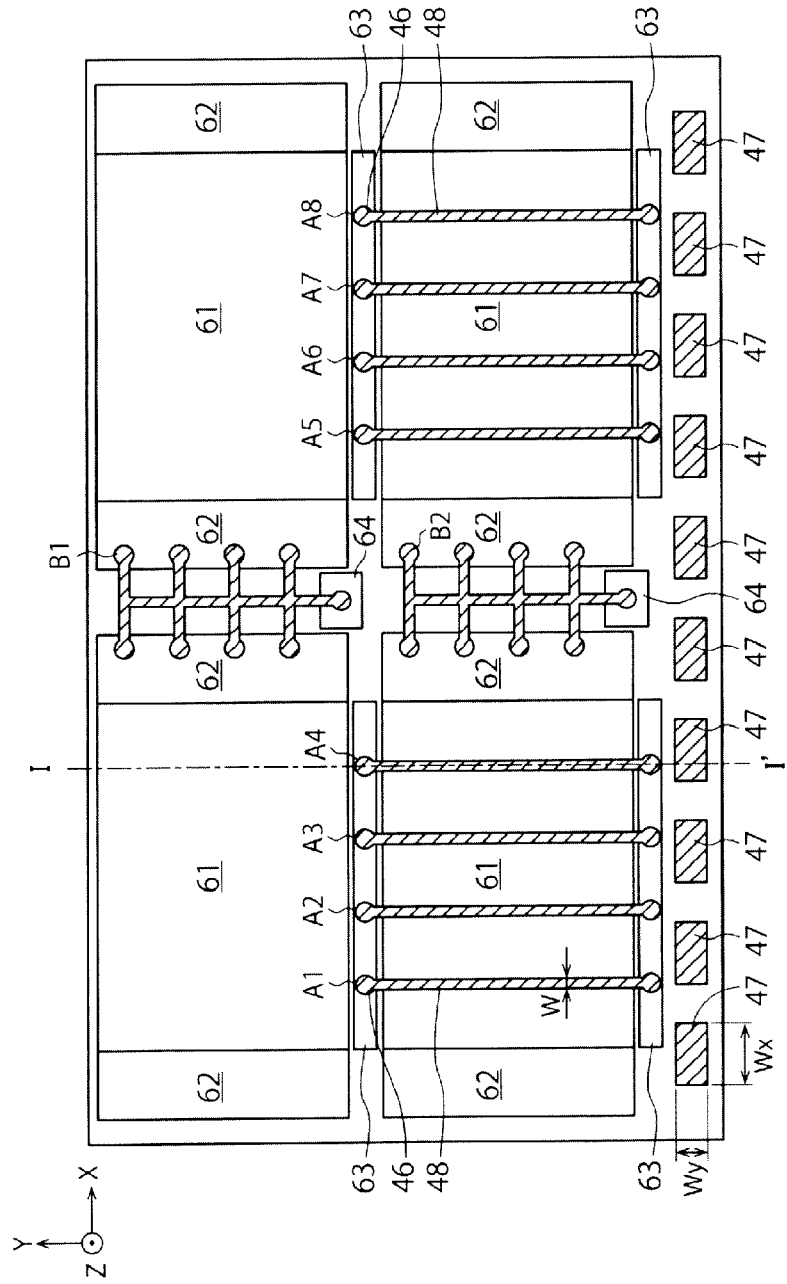
FIG. 5 is a plan view showing the structure of the semiconductor device of the first embodiment.

FIG. 5 is a plan view showing the structure of the semiconductor device of the first embodiment. FIG. 4 shows a cross section taken along a line I-I' in FIG. 5. Components present in different XY cross sections are also shown together in the plan view of FIG. 5 for convenient explanation. For a detailed positional relationship between the components, refer to the cross-sectional view of FIG. 4.

FIG. 5 shows four planes 61 that configures the memory cell array 11. The memory cell array 11 includes a plurality of memory cells, and these memory cells operate in units referred to as planes 61. Specifically, a write operation, a read operation, and an erase operation with respect to the memory cell are performed in each plane 61. FIG. 5 further shows eight row decoders 62, four data processing circuits 63, and two control voltage generating circuits 64 provided for these planes 61. The row decoders 62, the data processing circuits 63, and the control voltage generating circuits 64 are located near the memory cell array 11 in the array chip 1 or in the logic circuit in the circuit chip 2.

The row decoder 62 applies a control voltage to a control wiring such as the word line WL of the memory cell array 11. An example of such a control voltage is a write voltage (VPRG), an erase voltage (VERASE), an intermediate voltage (VPASS), a source voltage (VSL), and the like. The control voltage is generated by the control voltage generating circuit 64 and is supplied to the row decoder 62.

The data processing circuit 63 processes an input signal to the semiconductor device and an output signal from the semiconductor device. An example of such a signal is a data signal (DQ), a chip enable signal (CEn), a read enable signal (REn), a write enable signal (WEn), an address latch enable signal (ALE), and a command latch enable signal (CLE), and the like.

Similarly to FIG. 4, FIG. 5 further shows the pad 47 and the wiring 48 in the wiring layer 20. FIG. 5 shows, as an example, ten pads 47 and ten wirings 48 shown by symbols A1 to A8, B1 and B2. The wirings 48 are also referred to as "wirings A1 to A8, B1 and B2" as appropriate. FIG. 5 further schematically shows a position of the second plug 46 electrically connected to the wiring 48.

Symbol Wx represents a width of each pad 47 in the X direction, symbol Wy represents a width of each pad 47 in the Y direction, and symbol W represents a width of each wiring 48. The width W of the wiring 48 of the present embodiment is set to be smaller than the width Wx and Wy of the pad 47 (W<Wx, W<Wy). Further, values of the width Wx and Wy of the pad 47 may be different between different pads 47. Similarly, values of the width W of the wirings 48 may be different between different wirings 48.

The wirings A1 to A8 electrically connect one data processing circuit 63 to another data processing circuit 63, and are used to transmit the input signal and the output signal. The wirings A1 to A8 extend in the Y direction and the width W of the wirings A1 to A8 corresponds to a length of the wirings A1 to A8 in the X direction.

The wirings B1 and B2 are electrically connected with one control voltage generating circuit 64 and two row decoders 62, and are used to supply a control voltage generated by the control voltage generating circuit 64 to the row decoder 62. The wirings B1 and B2 include a first portion that extends in the X direction and a second portion that extends in the Y direction. The width W of the wirings B1 and B2 corresponds to a length of the wirings B1 and B2 in the Y direction in the first portion and corresponds to a length of the wirings B1 and B2 in the X direction in the second portion.

FIG. 5 schematically shows a portion (an end portion of the wiring 48 in an example of FIG. 5) that is in contact with the second plug 46 of the wiring 48 in a round shape. It should be noted, however, that the round shape is shown for clear understanding of a position of the second plug 46 and does not represent a shape of the wiring 48. Each wiring 48 is electrically connected to the row decoder 62, the data processing circuit 63, the control voltage generating circuit 64, and the like via the second plug 46. The width W of each wiring 48 in the present embodiment is constant without changing in a portion that is in contact with the second plug 46 and the other portion.

FIG. 6 is a cross-sectional view showing the structure of the second plug 46 of the first embodiment.

Figure 6A:
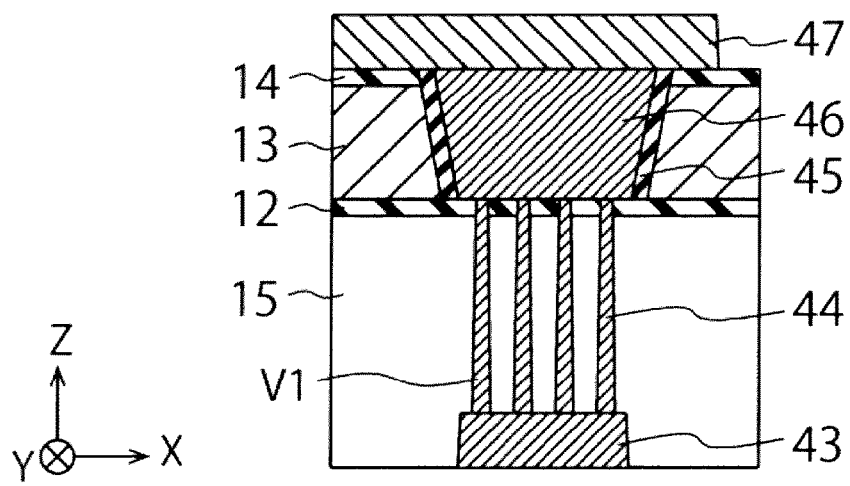
FIGS. 6A and 6B are cross-sectional views showing a structure of a second plug of the first embodiment.
Figure 6B:
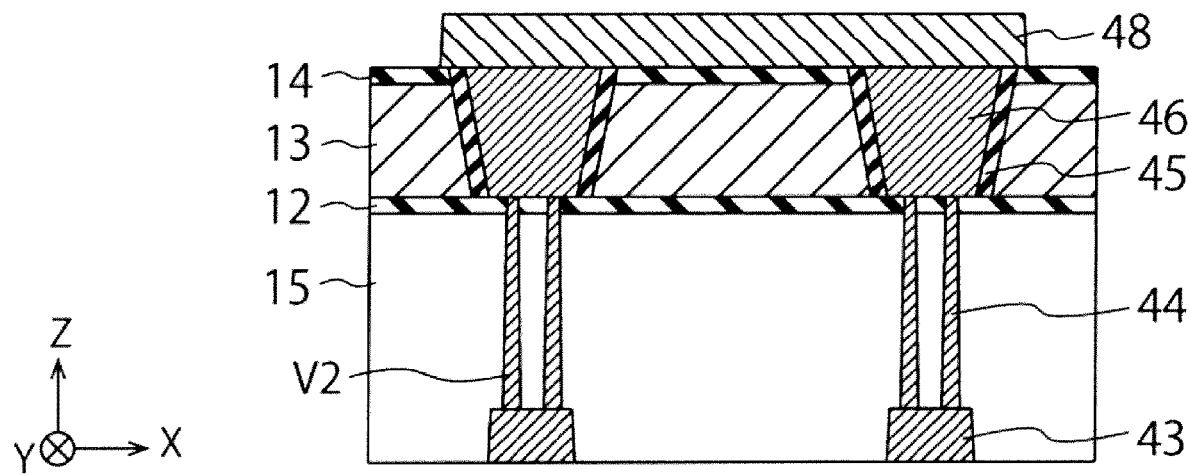

Referring again to FIG. 4, four first plugs 44 are shown. Each of these first plugs 44 may include a plurality of thin plugs as shown in FIG. 6A or FIG. 6B. FIG. 6A shows a first plug 44 that includes a plurality of thin plugs V1 and is provided under the pad 47. FIG. 6B shows a first plug 44 that includes a plurality of thin plugs V2 and is provided under the wiring 48.

According to the present embodiment, since each first plug 44 includes a plurality of thin plugs, electric resistance can be reduced compared to a case where each first plug 44 includes one thin plug.

As shown in FIG. 6A, two first plugs 44 under the pad 47 include a plurality of plugs V1. The two first plugs 44 under the pad 47 include, for example, one hundred plugs V1. Further, as shown in FIG. 6B, each of the two first plugs 44 under the wiring 48 also includes a plurality of plugs V2. Each of the two first plugs 44 under the wiring 48 includes, for example, fifty plugs V2. In this case, the semiconductor device of the present embodiment includes one set of plugs V1 under the pad 47 and two sets of plugs V2 under the wiring 48. The one set of plugs V1 includes one hundred plugs V1 and one set of plugs V2 includes fifty plugs V2. The reason why the number of the latter is smaller than the number of the former is that the width W of the wiring 48 is smaller than the width Wx and Wy of the pad 47.

Further, similarly to the first plug 44, each second plug 46 may include a plurality of thin plugs.

Figure 7:
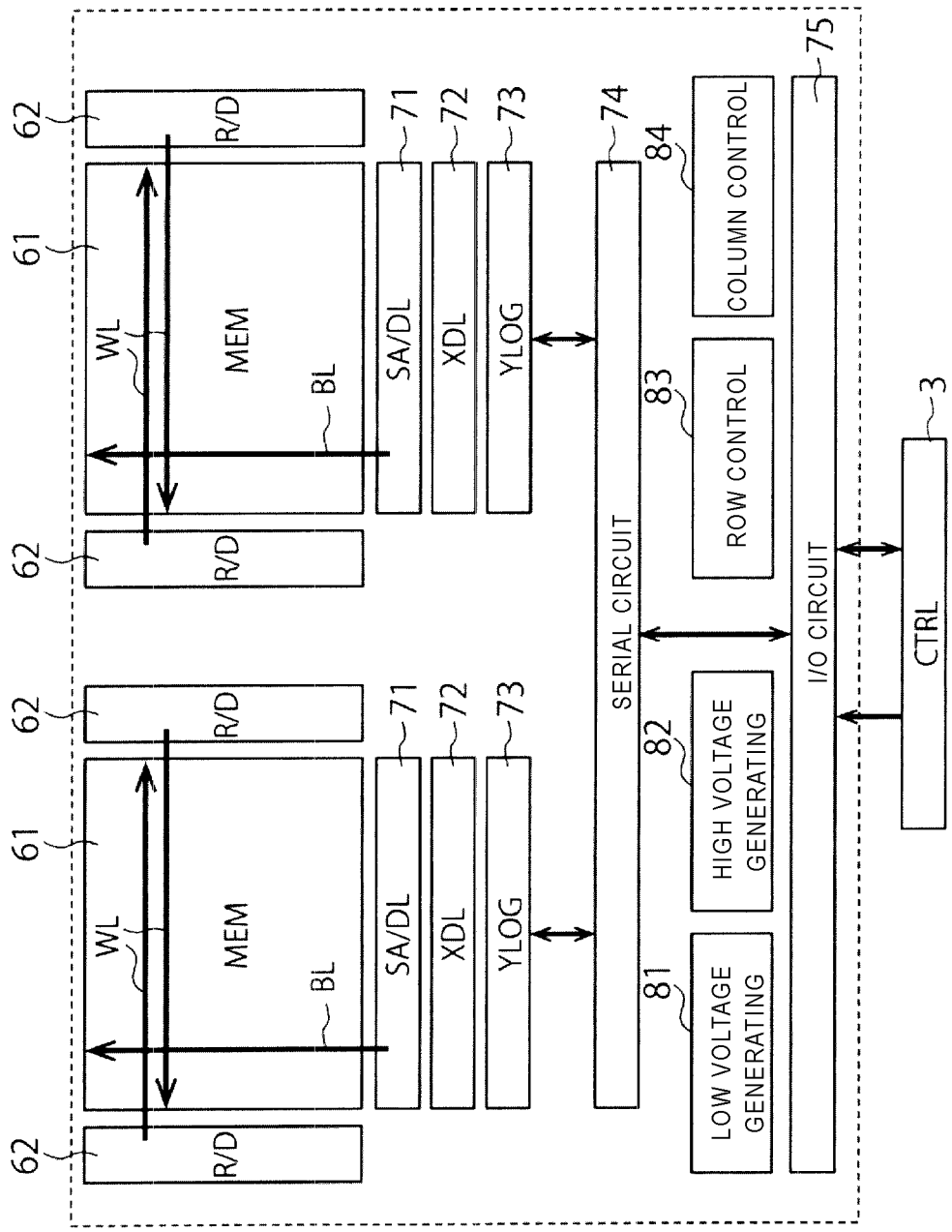
FIG. 7 is a circuit diagram showing a configuration of the semiconductor device of the first embodiment.

FIG. 7 is a circuit diagram showing a configuration of the semiconductor device of the first embodiment.

FIG. 7 shows a plurality of planes 61 that configure the memory cell array 11, a plurality of row decoders 62 provided for these planes 61, a plurality of SA/DL units 71, a plurality of XDL units 72, and a plurality of YLOG units 73. FIG. 7 further shows a serial circuit 74, an I/O (Input/Output) circuit 75, a low voltage generating circuit 81, a high voltage generating circuit 82, a row control circuit 83, and a column control circuit 84. These are positioned near the memory cell array 11 in the array chip 1 or in the logic circuit in the circuit chip 2. FIG. 7 further shows a controller 3 in the semiconductor device of the present embodiment.

Each SA/DL unit 71 is a sense amplifier circuit and a data latch circuit that detect data read to a bit line BL of the plane 61. Each XDL unit 72 is a data latch circuit that stores data sent from the SA/DL unit 71 or the I/O circuit 75. Each YLOG unit 73 decodes a column address and selects a latch circuit in the XDL units 72 based on a decoding result. The serial circuit 74 provides a serial bus and the like shared by the plurality of planes 61, and the I/O circuit 75 transmits and receives the input signal and the output signal to and from the controller 3.

The low voltage generating circuit 81 and the high voltage generating circuit 82 are configured to be the above-mentioned control voltage generating circuit 64 and respectively generate a low voltage and a high voltage that are used as control voltages. The row control circuit 83 and the column control circuit 84 respectively control a row and a column of each plane 61.

The wirings A1 to A8 (see FIG. 5) of the present embodiment are used, for example, to transmit and receive an input signal or an output signal between the I/O circuit 75 and the XDL unit 72. Further, the wirings B1 and B2 (see FIG. 5) of the present embodiment are used, for example, to supply a control voltage from the low voltage generating circuit 81 or the high voltage generating circuit 82 to the row decoder 62.

Hereinafter, the semiconductor device of the present embodiment will be described in detail with reference to FIG. 4 and FIG. 5.

As shown in FIG. 4, the semiconductor device of the present embodiment includes the pad 47 at a position higher than the memory cell array 11 or the logic circuit, and leaves a space for disposing a structure in the vicinity of the pad 47. Therefore, the wiring 48 is disposed in the vicinity of the pad 47 and the wiring 48 is used as a signal line or a control voltage line in the present embodiment.

Therefore, according to the present embodiment, a wiring can be effectively disposed in the semiconductor device as in the following examples. For example, congestion of wirings between the substrate 13 and the substrate 19 can be relieved by disposing a certain wiring above the substrate 13 as the wiring 48 instead of between the substrate 13 and the substrate 19. Further, in a case where the wiring 48 is used as a signal line, a signal noise in the signal line can be reduced since the wiring 48 is positioned above the substrate 13 which is hardly affected by a noise. Further, the number of wiring layers between the substrate 13 and the substrate 19 can be reduced by reducing the number of wirings between the substrate 13 and the substrate 19. As a result, a thickness of the semiconductor device can be thinned and the operation of the semiconductor device can be accelerated by shortening the length of wirings. Further, in a case where the wiring 48 is used as a control voltage line, the influence of wiring resistance with respect to a control voltage can be reduced by taking advantage of an extra space to make the wiring 48 thicker.

In the present embodiment, the wiring 48 is formed from the same wiring layer 20 with the pad 47. Alternatively, the wiring 48 may be formed from another wiring layer 20 formed in different processes as long as the wiring 48 and the pad 47 are on the same plane (here on the insulating layer 14). However, as described above, for example in a step of forming the pad 47, if the wiring 48 is also formed as the same wiring layer 20 at the same time, it is advantageous that a manufacturing process of a semiconductor device can be simplified.

As described above, according to the present embodiment, a wiring can be effectively laid out in the semiconductor device by disposing not only the pad 47 but also the wiring 48 above the substrate 13.

Second Embodiment

Figure 8:
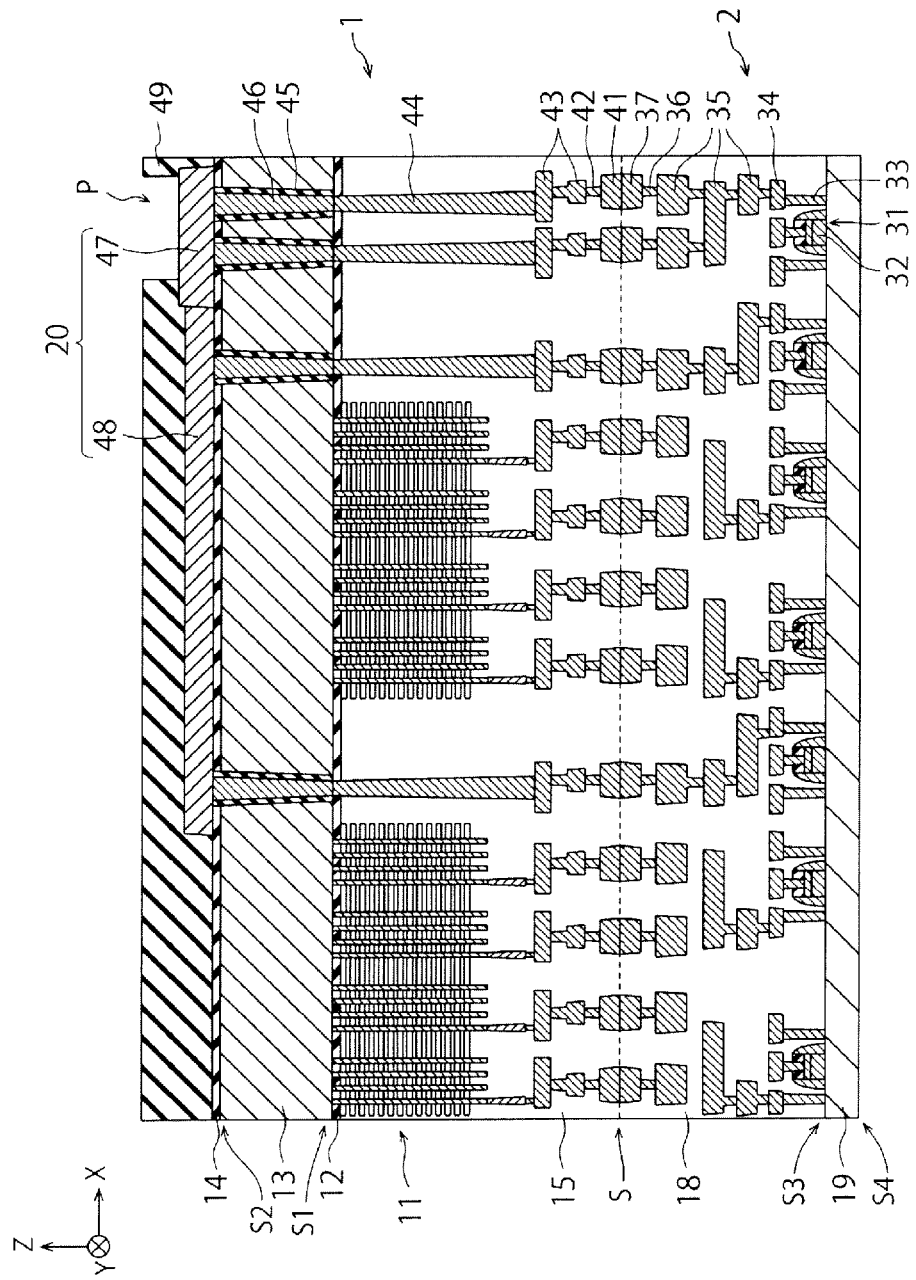
FIG. 8 is a cross-sectional view showing a structure of a semiconductor device of a second embodiment.

FIG. 8 is a cross-sectional view showing a structure of a semiconductor device of a second embodiment.

FIG. 8 is a cross-sectional view similar to FIG. 4. However, the wiring 48 in FIG. 4 is provided at a position not in contact with the pad 47, while the wiring 48 in FIG. 8 is provided at a position in contact with the pad 47. Similarly to the first embodiment, the wiring 48 in the present embodiment is formed from the same wiring layer 20 with the pad 47. Alternatively, the wiring 48 may be formed from a wiring layer 20 different from the pad 47. Further, FIG. 8 shows a step between an upper surface of the pad 47 and an upper surface of the wiring 48 for clear understanding, although such a step may not be provided.

Figure 9:
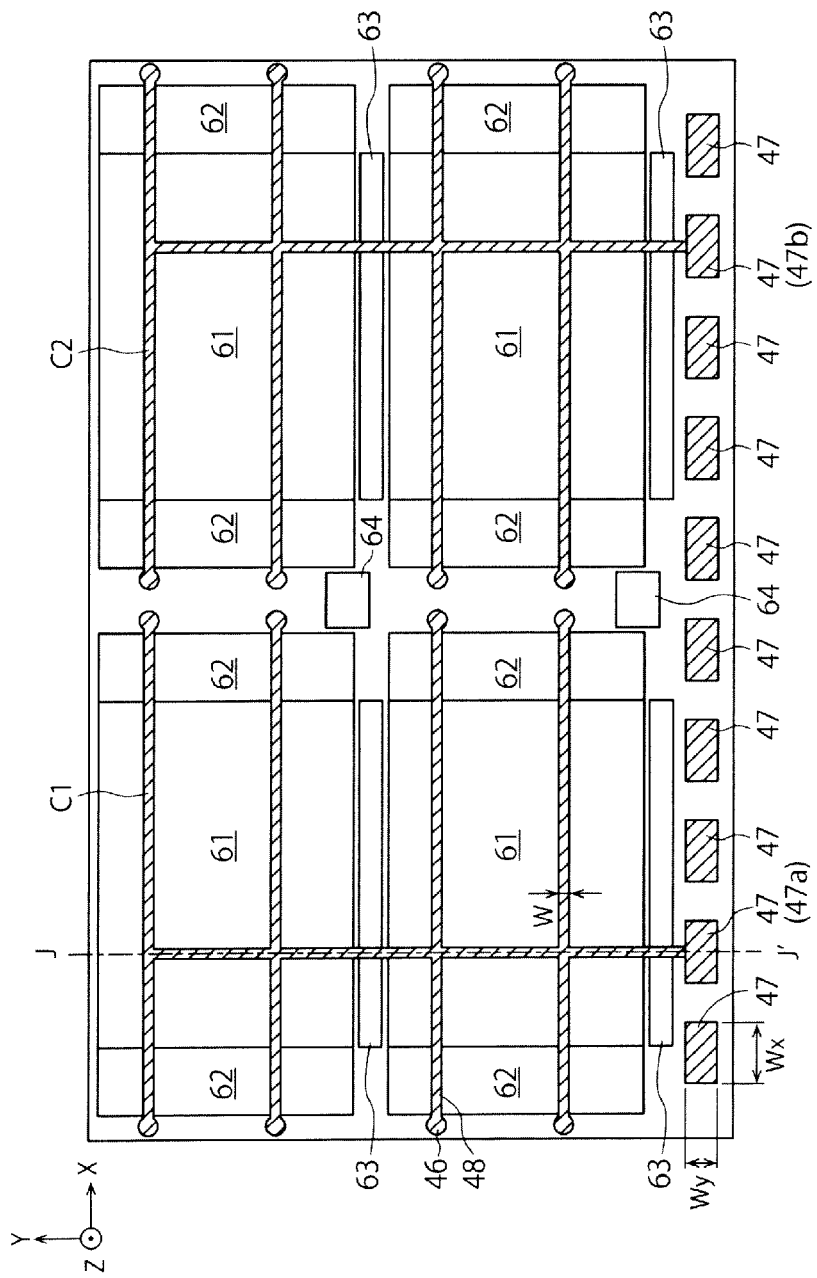
FIG. 9 is a plan view showing the structure of the semiconductor device of the second embodiment.

FIG. 9 is a plan view showing the structure of the semiconductor device of the second embodiment. FIG. 8 shows a cross section taken along a J-J' line in FIG. 9. However, it should be noted that a position of the second plug 46 under the wiring 48 in FIG. 8 is different from that in FIG. 9 for clear understanding.

Similarly to FIG. 8, FIG. 9 shows the pad 47 and the wiring 48 in the wiring layer 20. FIG. 9 shows, as an example, ten pads 47 and two wirings 48 represented by symbols C1 and C2. These pads 47 include two power supply pads 47a and 47b. The wirings 48 are also appropriately referred to as "wirings C1 and C2". FIG. 9 further schematically shows a position of the second plug 46 electrically connected to these wirings 48.

A symbol Wx represents a width of each pad 47 in the X direction, a symbol Wy represents a width of each pad 47 in the Y direction, and a symbol W represents a width of each wiring 48. Similarly to the first embodiment, the width W of the wiring 48 of the present embodiment is set to be smaller than the width Wx and Wy of the pad 47 (W<Wx, W<Wy). Further, values of the width Wx and Wy of the pad 47 may be different between different pads 47. Similarly, a value of the width W of the wiring 48 may be different between different wirings 48.

The wiring C1 is electrically connected with the power supply pad 47a and a peripheral circuit of the semiconductor device, and is used to supply power to the semiconductor device. Similarly, the wiring C2 is electrically connected with the power supply pad 47b and a peripheral circuit of the semiconductor device, and is used to supply power to the semiconductor device. These wirings C1 and C2 include a first portion that extends in the X direction and a second portion that extends in the Y direction. The width W of the wirings C1 and C2 corresponds to a length of the wirings C1 and C2 in the Y direction in the first portion and corresponds to a length of the wirings C1 and C2 in the X direction in the second portion.

An example of the wirings C1 and C2 is a power supply line that supplies a grounding voltage (VSS voltage), a power supply voltage (VDD voltage), or another power supply voltage (VDDQ voltage). For example, the wiring C1 is a VSS voltage line and the wiring C2 is a VDD voltage line. In this case, the power supply pad 47a is used to apply a VSS voltage to the semiconductor device and the power supply pad 47b is used to supply a VDD voltage to the semiconductor device.

FIG. 9 schematically shows a position of the second plug 46 electrically connected to these wirings 48 in a round shape. It should be noted that the round shape is shown for clear understanding of the position of the second plug 46 and does not represent a shape of the second plug 46. Each wiring 48 is electrically connected to a peripheral circuit of the semiconductor device and the like via the second plug 46. The width W of each wiring 48 of the present embodiment is set to the same value at a portion directly above the second plug 46 and at the other portion. It should be noted that the semiconductor device of the present embodiment includes the second plug 46 also under each pad 47 (see FIG. 8).

According to the present embodiment, similarly to the first embodiment, a wiring can be effectively disposed in the semiconductor device. For example, in a case where the wiring 48 is used as a power supply line, the influence of wiring resistance with respect to power supply can be reduced by taking advantage of an extra space to make the wiring 48 thicker.

Further, the arrangement of the wiring 48 shown in FIG. 5 and the arrangement of the wiring 48 shown in FIG. 9 may be applied to the same semiconductor device at the same time. Further, while the semiconductor device according to the first embodiment or the second embodiment is a three-dimensional memory manufactured from two wafers (the array wafer W1 and the circuit wafer W2), these embodiments may also be applied to a semiconductor device manufactured from one wafer or a semiconductor device other than a three-dimensional memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first chip including a first semiconductor substrate and a logic circuit provided on the first semiconductor substrate;
   a second chip bonded on the first chip and including a memory cell array and a second semiconductor substrate provided above the memory cell array;
   a plurality of bonding metals provided on a bonding surface of the first chip and the second chip;
   a plurality of plugs extending through the second semiconductor substrate;
   a bonding pad provided above the second semiconductor substrate and electrically connected to the logic circuit via a first bonding metal of the plurality of bonding metals and a first plug of the plurality of plugs; and
   a wiring provided above the second semiconductor substrate, electrically connected to the logic circuit via a second bonding metal of the plurality of bonding metals and a second plug of the plurality of plugs, and including at least one of a data signal line, a control voltage line, or a power supply line.

2. The semiconductor device according to claim 1, wherein the bonding pad and the wiring are provided in a same wiring layer provided above the second semiconductor substrate.

3. The semiconductor device according to claim 1, further comprising: an insulating film provided over the wiring and includes an opening to expose at least a portion of an upper surface of the bonding pad.

4. The semiconductor device according to claim 1, wherein the memory cell is provided above the logic circuit.

5. The semiconductor device according to claim 1, wherein the wiring is configured to at least one of: transmit an input signal to the semiconductor device or an output signal from the semiconductor device, supply a control voltage to the memory cell array, or supply power to the semiconductor device.

6. The semiconductor device according to claim 1, wherein the wiring is not in contact with the bonding pad.

7. The semiconductor device according to claim 1, wherein the wiring is in contact with the bonding pad.

8. A method of manufacturing a semiconductor device, comprising:
   forming a first chip including:
      providing a first semiconductor substrate;
      forming a logic circuit on the first semiconductor substrate; and
      forming a plurality of bonding metals on a bonding surface of the first chip;
   forming a second chip including:
      providing a second semiconductor substrate having a first surface and a second surface;
      forming a memory cell array on the first surface of the second semiconductor substrate;
      forming a plurality of bonding metals on a bonding surface of the second chip; and
      forming a plurality of plugs extending through the second semiconductor substrate;
   forming a bonding pad on the second surface of the second semiconductor substrate that is electrically connected to the logic circuit via first ones of bonding metals on the bonding surfaces of the first and second chips and a first plug of the plurality of plugs; and
   forming a wiring on the second surface of the second semiconductor substrate, electrically connected to the logic circuit via second ones of bonding metals on the bonding surfaces of the first and second chips and a second plug of the plurality of plugs, and including at least one of a data signal line, a control voltage line, or a power supply line.

9. The method of manufacturing a semiconductor device according to claim 8, further comprising:
   forming a wiring layer on the second surface of the second semiconductor substrate; and
   processing the wiring layer to form the bonding pad and the wiring.

10. The method of manufacturing a semiconductor device according to claim 8, further comprising:
    bonding the first semiconductor substrate and the second semiconductor substrate via the memory cell array and the logic circuit.

11. A semiconductor device, comprising:
    a first chip including a first semiconductor substrate and a logic circuit provided on the first semiconductor substrate;

a second chip bonded on the first chip, the second chip including (i) a second semiconductor substrate having a first surface and a second surface, and (ii) a memory cell array provided on the first surface of the second semiconductor substrate and coupled to the logic circuit through one or more conductive structures;

a plurality of bonding metals provided on a bonding surface of the first chip and the second chip;

a plurality of plugs extending through the second semiconductor substrate;

a bonding pad, provided on the second surface of the second semiconductor substrate, that is electrically connected to the logic circuit via a first bonding metal of the plurality of bonding metals and a first plug of the plurality of plugs; and a wiring provided on the second surface of the second semiconductor substrate, electrically connected to the logic circuit via a second bonding metal of the plurality of bonding metals and a second plug of the plurality of plugs, and including at least one of a data signal line, a control voltage line, or a power supply line.

12. The semiconductor device of claim 11, wherein the wiring is not in contact with the bonding pad.

13. The semiconductor device of claim 11, wherein the wiring is in contact with the bonding pad.

14. The semiconductor device of claim 11, wherein the bonding pad and the wiring are provided in a same wiring layer provided on the second surface of the second semiconductor substrate.

* * * * *